United States Patent
Ho et al.

(10) Patent No.: US 10,313,024 B1
(45) Date of Patent: Jun. 4, 2019

(54) TRANSMITTER OPTICAL SUBASSEMBLY WITH TRACE ROUTING TO PROVIDE ELECTRICAL ISOLATION BETWEEN POWER AND RF TRACES

(71) Applicant: Applied Optoelectronics, Inc., Sugar Land, TX (US)

(72) Inventors: I-Lung Ho, Sugar Land, TX (US); Kevin Liu, Houston, TX (US); YongXuan Liang, Stafford, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 15/963,246

(22) Filed: Apr. 26, 2018

(51) Int. Cl.
| | |
|---|---|
| H04J 14/02 | (2006.01) |
| H04B 10/00 | (2013.01) |
| H04B 10/80 | (2013.01) |
| H01S 5/022 | (2006.01) |
| H01S 5/024 | (2006.01) |
| H01S 5/40 | (2006.01) |
| H04B 10/50 | (2013.01) |
| H01S 5/042 | (2006.01) |

(52) U.S. Cl.
CPC .......... *H04B 10/80* (2013.01); *H01S 5/0222* (2013.01); *H01S 5/02284* (2013.01); *H01S 5/02415* (2013.01); *H01S 5/042* (2013.01); *H01S 5/4087* (2013.01); *H04B 10/50* (2013.01); *H04J 14/02* (2013.01)

(58) Field of Classification Search
USPC .......................................... 398/135, 164, 79
See application file for complete search history.

(56) References Cited

U.S. PATENT DOCUMENTS

| | | | | |
|---|---|---|---|---|
| 7,798,820 | B2* | 9/2010 | Hong | H05K 1/117 385/92 |
| 9,614,620 | B2* | 4/2017 | Ho | G02B 6/43 |
| 2004/0163836 | A1* | 8/2004 | Kumar | H01S 5/02212 174/50 |
| 2005/0105915 | A1* | 5/2005 | Light | G02B 6/4292 398/164 |
| 2005/0175350 | A1* | 8/2005 | Hartzell | G02B 6/4246 398/135 |

(Continued)

*Primary Examiner* — David C Payne
*Assistant Examiner* — Pranesh K Barua
(74) *Attorney, Agent, or Firm* — Grossman Tucker Perreault & Pfleger, PLLC; Norman S. Kinsella

(57) ABSTRACT

The present disclosure is generally directed to a transmitter optical subassembly (TOSA) having a hermetically-sealed housing with a feedthrough device that electrically isolates RF and power traces. In more detail, a TOSA consistent with the present disclosure includes a substrate with driving circuitry disposed thereon. A first end of the substrate may electrically couple to transmit connecting circuitry and a second end may couple to a hermetically-sealed housing. The hermetically-sealed housing can include one or more laser packages for emitting associated channel wavelengths in addition to monitor photodiodes (PDs), and temperature control devices such as TECs. The hermetic-sealed housing includes a first end with a feedthrough device that provides traces to electrically couple to the circuitry of the substrate. The hermetic-sealed housing further includes an optical coupling port, e.g., a LC connector, for coupling to an external fiber, for example.

17 Claims, 4 Drawing Sheets

(56) References Cited

U.S. PATENT DOCUMENTS

| | | | | |
|---|---|---|---|---|
| 2005/0225955 A1* | 10/2005 | Grebenkemper | .... | H05K 1/0218 |
| | | | | 361/780 |
| 2005/0286906 A1* | 12/2005 | Togami | ................ | G02B 6/4277 |
| | | | | 398/164 |
| 2007/0237472 A1* | 10/2007 | Aronson | .............. | G02B 6/4292 |
| | | | | 385/101 |
| 2011/0188863 A1* | 8/2011 | Mason | ................... | H04B 10/40 |
| | | | | 398/137 |
| 2012/0301152 A1* | 11/2012 | Edwards | .............. | G02B 6/4201 |
| | | | | 398/135 |
| 2013/0114629 A1* | 5/2013 | Firth | .................... | G02B 6/4201 |
| | | | | 372/20 |
| 2014/0152373 A1* | 6/2014 | Romas, Jr. | ............. | H01L 25/18 |
| | | | | 327/374 |
| 2015/0162989 A1* | 6/2015 | Oomori | ................. | H04B 10/50 |
| | | | | 398/201 |
| 2015/0162990 A1* | 6/2015 | Daiber | ................. | H04B 10/503 |
| | | | | 398/183 |
| 2016/0139477 A1* | 5/2016 | Jack | ........................ | G09G 3/19 |
| | | | | 359/275 |
| 2017/0272169 A1* | 9/2017 | Ho | ........................ | H04B 10/40 |

\* cited by examiner

TRANSMITTER OPTICAL SUBASSEMBLY WITH TRACE ROUTING TO PROVIDE ELECTRICAL ISOLATION BETWEEN POWER AND RF TRACES

TECHNICAL FIELD

The present disclosure relates to optical communications and more particularly, to a transmitter optical subassembly (TOSA) with a hermetically-sealed light engine housing that electrically isolates DC and RF traces to ensure nominal performance.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals. In general, TOSAs include one or more lasers to emit one or more channel wavelengths and associated circuitry for driving the lasers. Some optical applications, such as long-distance communication, may require TOSAs to include hermetically-sealed housings with arrayed waveguide gratings, laser packages and associated circuitry disposed therein to reduce loss and ensure optical performance. However, the inclusion of hermetically-sealed components increases manufacturing complexity, cost, and raises non-trivial challenges.

BRIEF DESCRIPTION OF THE DRAWINGS

These and other features and advantages will be better understood by reading the following detailed description, taken together with the drawings wherein:

FIG. 2C shows an enlarged region of the second side of the TOSA module shown in FIG. 2B in accordance with an embodiment of the present disclosure.

DETAILED DESCRIPTION

Figure 1A:
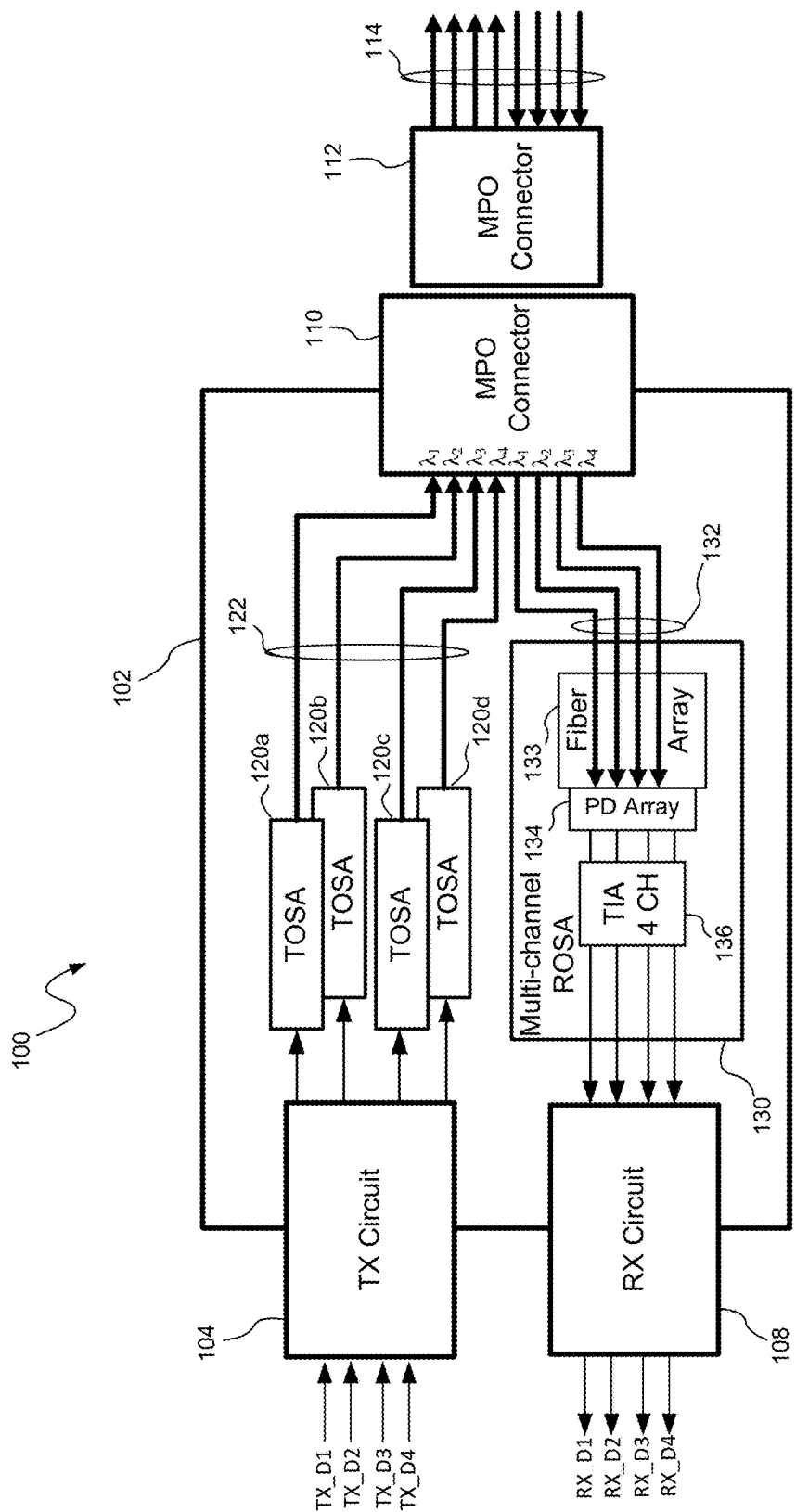
FIGS. 1A and 1B are block diagrams of multi-channel optical transceivers, consistent with embodiments of the present disclosure.

As discussed above, some TOSAs can reach optical transmission distances of up to 10 km or more. Such TOSAs may be suitable for use in C form-factor pluggable (CFP), CFP2, CFP4 and quad small form-factor pluggable (QSFP) applications. In general, such TOSAs include a hermetic-sealed package (or housing) with an LC receptacle (or other suitable port) for optical coupling. The hermetic-sealed package can house laser packages, e.g., electro-absorption modulator integrated lasers (EMLs), power monitors photodiodes (PDs), an optical multiplexer such as an arrayed waveguide grating for multiplexing multiple channel wavelengths, and electrical interconnects such as flexible printed circuit boards. To supply power such as direct current (DC) and RF signaling to drive the lasers, feedthrough devices may be utilized. The feedthrough device may include patterns/traces disposed thereon to propagate signals from external circuitry to components within the hermetic-sealed package. Multiple feedthrough devices may be utilized in some instances to provide both RF and DC signals. However, the available space to route traces shrinks as TOSA packages continue to scale, which can lead to electrical interference between DC and RF signals that may degrade performance.

Thus, the present disclosure is generally directed to a TOSA having a hermetically-sealed housing with a feedthrough device that electrically isolates RF traces from power-related traces (e.g., DC traces, ground traces) by disposing power and RF traces on opposite sides. This configuration of power and RF traces may also be referred to as an opposing arrangement. In more detail, a TOSA consistent with the present disclosure includes a substrate with driving circuitry disposed thereon. A first end of the substrate may electrically couple to transmit connecting circuitry and a second end may couple to a hermetically-sealed housing. Thus, the first end may be referred to as an electrical coupling end and the second end may be referred to as a light engine interface end. The hermetically-sealed housing can include one or more laser packages for emitting channel wavelengths in addition to monitor photodiodes (PDs), and temperature control devices such as TECs. The hermetically-sealed housing includes a first end with a feedthrough device that provides traces to electrically couple to the circuitry of the substrate. The hermetically-sealed housing further includes an optical coupling port, e.g., a LC connector, for coupling to an external fiber, for example. A first side of the feedthrough device may include traces configured to propagate power signals, e.g., DC signals, from circuitry of the substrate to components within the hermetically-sealed housing. On the other hand, a second side of the feedthrough device, opposite the first side, may include traces configured to propagate RF signals from circuitry of the substrate to components within the hermetically-sealed housing.

Therefore, the RF and power signal traces of the feedthrough device may be electrically isolated from each other based on the distance therebetween, e.g., provided by the width of the feedthrough device, and/or the material properties of the feedthrough device. For example, the feedthrough device may comprise ceramic or other suitable material that may provide electrical shielding. Likewise, the power and RF traces may be similarly disposed and routed on either side of the substrate to minimize or otherwise reduce electrical interference. In addition, a first type of interconnect device such as DC bus bars or other similarly rigid device may be utilized to electrically couple traces of the substrate to the corresponding power traces (including ground traces) of the feedthrough substrate. A plurality of the first type of interconnect devices may be both used to provide power and to brace the hermetically-sealed housing to the substrate. A second type of interconnect device, different from the first type, such as wire bonding may be utilized to electrically couple the substrate to the RF traces of the feedthrough device. Wire bonding, although particularly well suited for high-speed RF transmission, can be relatively fragile and the increased rigidity of the interface between the substrate and the hermetic-sealed housing provided by the first type of interconnect device may advantageously provide bracing to limit stress that could break or otherwise compromise the wire bonds.

As used herein, the terms hermetic-sealed and hermetically-sealed may be used interchangeably and refer to a housing that releases a maximum of about $5*10^{-8}$ cc/sec of filler gas. The filler gas may comprise an inert gas such as nitrogen, helium, argon, krypton, xenon, or various mixtures thereof, including a nitrogen-helium mix, a neon-helium mix, a krypton-helium mix, or a xenon-helium mix.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Referring to the Figures, FIG. 1A, an optical transceiver 100, consistent with embodiments of the present disclosure, is shown and described. In this embodiment, the optical transceiver 100 transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be 1270 nm, 1290 nm, 1310 nm, and 1330 nm, respectively. Other channel wavelengths are within the scope of this disclosure including those associated with local area network (LAN) wavelength division multiplexing (WDM). The optical transceiver 100 may also be capable of transmission distances of 2 km to at least about 10 km. The optical transceiver 100 may be used, for example, in internet data center applications or fiber to the home (FTTH) applications.

This embodiment of the optical transceiver 100 includes multiple transmitter optical subassemblies (TOSAs) 120a-d for transmitting optical signals on different channel wavelengths and a multi-channel receiver optical subassembly (ROSA) 130 for receiving optical signals on different channel wavelengths. The TOSAs 120a-d and the multi-channel ROSA 130 are located in a transceiver housing 102.

A transmit connecting circuit 104 and a receive connecting circuit 108 provide electrical connections to the TOSAs 120a-d and the multi-channel ROSA 130, respectively, within the housing 102. The transmit connecting circuit 104 is electrically connected to the electronic components (e.g., the laser, monitor photodiode, etc.) in each of the TOSAs 120a-d and the receive connecting circuit 108 is electrically connected to the electronic components (e.g., the photodiodes, the TIA, etc.) in the multi-channel ROSA 130. The transmit connecting circuit 104 and the receive connecting circuit 108 may be flexible printed circuits (FPCs) including at least conductive paths to provide electrical connections and may also include additional circuitry.

Each of the TOSAs 120a-d may be implemented as the TOSA 200 as discussed in greater detail below. Each TOSA may be electrically coupled to conductive paths on the transmit connecting circuit 104 and be configured to receive driving signals (e.g., TX_D1 to TX_D4) and launch channel wavelengths on to fibers of the transmit optical fibers 122.

A multi-fiber push on (MPO) connector 110 provides optical connections to the TOSAs 120a-d and the multi-channel ROSA 130 within the housing 102. The MPO connector 110 is optically coupled to the TOSAs 120a-d and the multi-channel ROSA 130 via transmit optical fibers 122 and receive optical fibers 132, respectively. The MPO connector 110 is configured to be coupled to a mating MPO connector 112 such that the optical fibers 122, 132 in the optical transceiver 100 are optically coupled to external optical fibers 114.

Continuing on, this embodiment of the multi-channel ROSA 130 shown in FIG. 1A includes a photodetector array 134 including, for example, photodiodes optically coupled to a fiber array 133 formed by the ends of the receive optical fibers 132. The multi-channel ROSA 130 also includes a multi-channel transimpedance amplifier 136 electrically connected to the photodetector array 134. The photodetector array 134 and the transimpedance amplifier 136 detect and convert optical signals received from the fiber array 133 into electrical data signals (RX_D1 to RX_D4) that are output via the receive connecting circuit 108. Other embodiments of a ROSA may also be used in the transceiver 100 for receiving and detecting one or more optical signals.

This embodiment of the optical transceiver 100 does not include an optical multiplexer or demultiplexer. The optical signals may be multiplexed and demultiplexed external to the optical transceiver 100.

Figure 1B:
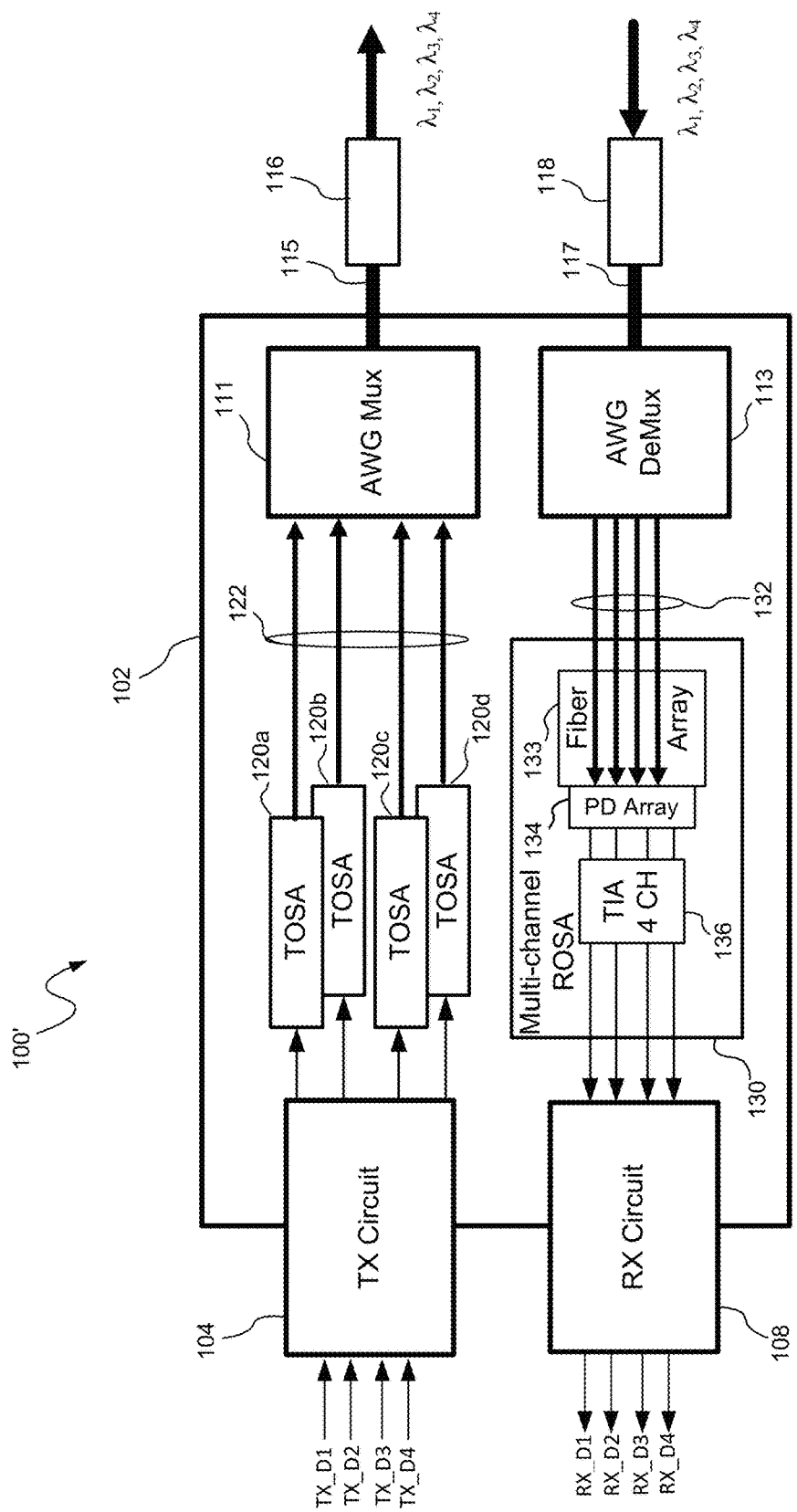

Referring to FIG. 1B, another embodiment of an optical transceiver 100' includes the same light engine (e.g., TOSAs 120a-d and ROSA 130) described above together with an optical multiplexer 111 and an optical demultiplexer 113. The optical multiplexer 111 and the optical demultiplexer 113 both may include arrayed waveguide gratings (AWGs). The optical multiplexer 111 is optically coupled to the transmit optical fibers 122 and the optical demultiplexer 113 is optically coupled to the receive optical fibers 132. The optical multiplexer 111 multiplexes the optical signals being transmitted over transmit optical fibers 122 to provide a multiplexed optical signal on an output optical fiber 115. The optical demultiplexer 113 demultiplexes a multiplexed optical signal received on an input optical fiber 117 to provide received optical signals on receive optical fibers 132. The output optical fiber 115 and the input optical fiber 117 are coupled to an output optical connector 116 and an input optical connector 118, respectively.

This embodiment of the optical transceiver 100' includes 4 channels and may be configured for coarse wavelength division multiplexing (CWDM), although other numbers of channels are possible. This embodiment of the optical transceiver 100' may also be capable of transmission rates of at least about 25 Gbps per channel and transmission distances of 2 km to at least about 10 km and may be used in internet data center applications or fiber to the home (FTTH) applications.

Figure 2A:
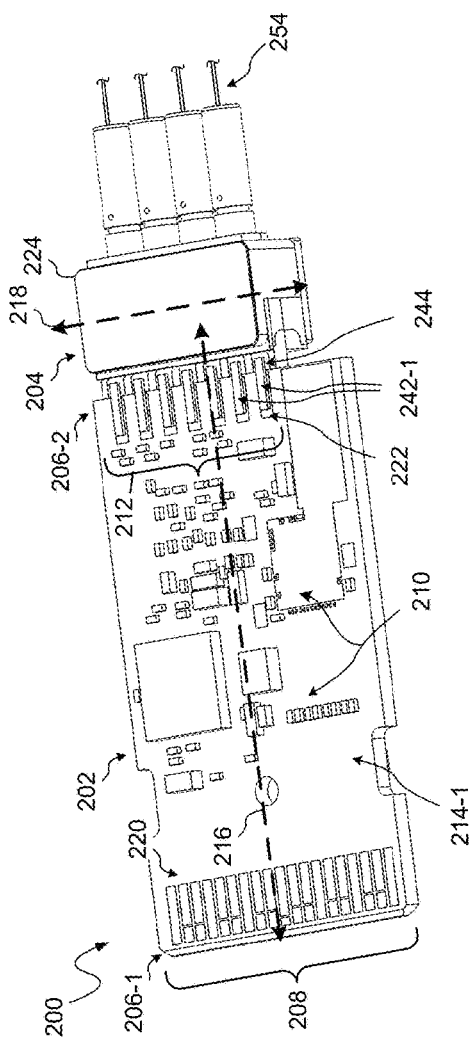
FIG. 2A is a perspective view of a first side of an transmitter optical subassembly (TOSA) module consistent with embodiments of the present disclosure.
Figure 2B:
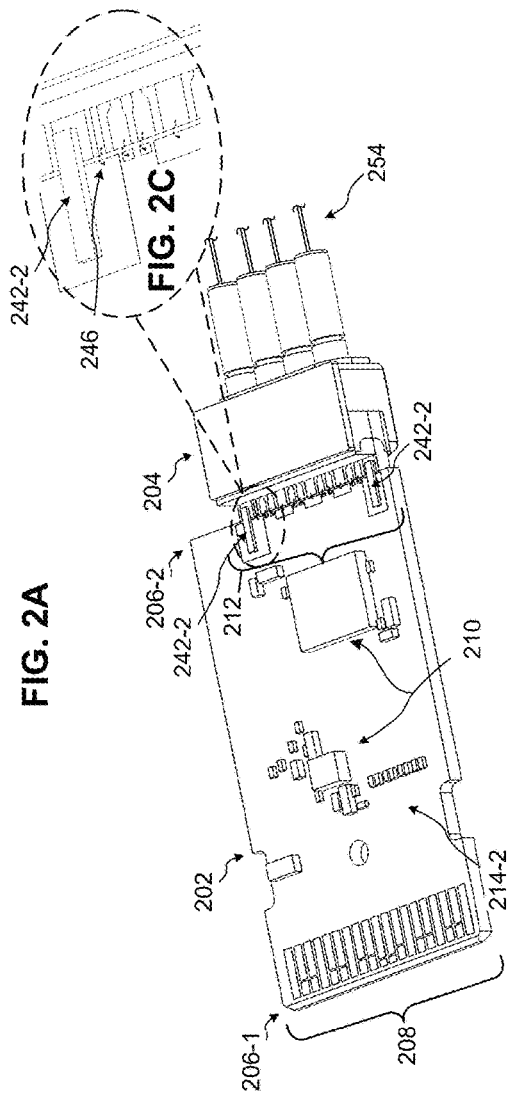
FIG. 2B is a perspective view of a second side of the TOSA module of FIG. 2A consistent with embodiments of the present disclosure.

Referring now to FIGS. 2A-2B, an example transmitter optical subassembly (TOSA) module 200 is shown consistent with an embodiment of the present disclosure. As shown, the TOSA 200 includes a substrate 202 and a hermetically-sealed light engine 204 coupled to an end of the substrate 202. In more detail, the substrate 202 includes a first end 206-1 that extends to a second end 206-2 along a longitudinal axis 216. The substrate may comprise a printed circuit board (PCB) formed of silicon or any other material capable of coupling/mounting to electrical components. The substrate 202 includes at least two mounting surfaces for mounting of components, such as mounting surfaces 214-1 and 214-2, which are disposed opposite each other in an opposing arrangement/configuration.

The substrate 202 includes a transmit circuit (TX) interface region 208 proximate the first end 206-1, a light engine interface region 212 proximate the second end 206-2 of the substrate, and a light engine driving circuit 210 disposed therebetween. The TX interface region 208 may include a plurality of terminals/pads 220 for electrically coupling to a transmit connecting circuit, e.g., transmit connecting circuit 104. The TX interface region 208 may therefore receive signals, e.g., power and other signals such as RF, from an associated transmit connecting circuit when coupled thereto. The light engine interface region 212 also includes terminals/pads 222 for electrically coupling to the hermetically-sealed light engine 204.

The light engine driving circuit 210 may include power conversion circuitry and other chips/devices suitable for driving a light engine such as the hermetically-sealed light engine 204. The light engine driving circuit 210 may be disposed on one or more of the mounting surfaces of the substrate 202. For instance, as shown in FIGS. 2A and 2B, the light driving circuit is disposed on both the first and second mounting surfaces 214-1, 214-2. This dual-sided arrangement allows for separation of RF and DC traces which may advantageously minimize or otherwise reduce electrical interference with each other. However, this disclosure is not necessarily limited in this regard and the light driving circuit may be disposed on only one side of the substrate 202 depending on a desired configuration. The light engine driving circuit 210 may electrically couple to the TX interface region 208, and more specifically to the plurality of terminals/pads, via traces. Likewise, the light engine driving circuit 210 may electrically couple to the pads/terminals of the light engine interface region 212 via traces, which are described in greater detail below.

The hermetically-sealed light engine 204 includes a hermetically-sealed housing 224 or housing 224 defined by a plurality of sidewalls. The housing 224 may include a longitudinal axis 218 that extends substantially transverse relative to the longitudinal axis 216 of the substrate 202. The housing 224 may comprise, for example, metal, plastic, ceramic, or any other suitable material. The housing 224 may be formed from multiple pieces, or a single piece, of material.

The housing 224 may further define a laser cavity 226 (FIG. 3) which may be filled with an inert gas to form an inert atmosphere. In one embodiment, the inert atmosphere sealed within the hermetically-sealed container comprises nitrogen, and preferably, 1 atmosphere (ATM) of nitrogen. The inert atmosphere may also be formed from nitrogen, helium, argon, krypton, xenon, or various mixtures thereof, including a nitrogen-helium mix, a neon-helium mix, a krypton-helium mix, or a xenon-helium mix. The inert gas or gas mix included within the hermetically-sealed container may be selected for a particular refractive index or other optical property. Gases may also be selected based on their ability to promote thermal insulation. For instance, Helium is known to promote heat transfer may be utilized alone or in addition to others of the aforementioned gases. In any event, the terms hermetic-sealed and hermetically-sealed may be used interchangeably and refers to a housing that releases a maximum of about $5*10^{-8}$ cc/sec of filler gas.

As shown, the housing 224 may abut (e.g., directly couple to) the second end 206-2 of the substrate 202 and extend therefrom. This may also be referred to as an end-to-end connection between the housing 224 and the substrate 202. The housing 224 may be securely attached to the substrate via an adhesive or other suitable device such as screws, rivets, friction-fit, tongue-and-groove or any combination thereof. However, the housing 224 may not necessarily directly couple to the second end 206-2 of the substrate 202 and the housing 224 may indirectly couple to the second end 206-2 of the substrate 202 via an intermediate device/structure.

Alternatively, or in addition to adhesive or other attachment devices, the housing 224 may be securely attached to the substrate 202 based on electrical interconnect devices (or simply interconnects) soldered or otherwise coupled between the substrate 202 and the housing 224 such as shown in FIGS. 2A and 2B. For example, a first type of interconnects referred to collectively as 242 and individually as 242-1 and 242-2 may be coupled to the substrate 202 by way of respective pads 222. The first type of interconnect devices 242 may be substantially similar in dimension and type, although other embodiments are within the scope of this disclosure. For instance, each of the interconnect devices 242 may have substantially similar dimensions and may each comprise copper, aluminum, steel or any other suitably conductive metal or metal alloy. In other cases, the interconnect devices 242-1 may comprise a different metal material than that of the interconnect devices 242-2 and have different dimensions. In one specific example embodiment, the interconnect devices 242 comprise DC bus bar interconnects.

As shown, the interconnects 242-1 may be coupled to the first surface 214-1 of the substrate 202 and the interconnects 242-2 may be disposed opposite the interconnects 242-1 on the second surface 214-2 of the substrate 202. This opposing configuration/arrangement of interconnects may increase structural stability of the interface between the housing 224 and the substrate 202 versus only coupling interconnects on only one side of the substrate 202. In this embodiment, each of the first interconnect devices 242-1 may be disposed in a coextensive manner with corresponding ones of the second interconnect devices 242-2, although in other cases the interconnect devices may be disposed in a staggered manner and may not necessarily be coextensive. In some cases the interconnects 242 may only be coupled on one side to provide electrical communication between the substrate 202 and the housing 224 and this disclosure should not be construed as limiting in this regard.

In any event, the interconnect devices 242 may be suitably rigid, and thus prevent or otherwise mitigate rotational movement of the housing 224 relative to the substrate 202. A substantial portion, e.g., greater than 50%, of the bottom surface of each of the interconnect devices 242 may couple to the pads 222 of the substrate 202. This may allow the interconnect devices 242 to have a relatively large amount of surface area in contact with the substrate 202 to allow for additional soldering. The additional soldering may further increase structural support and securely hold the housing 224 in position relative to the substrate 202. Thus, in some cases, the ratio of surface area of each of the interconnects 242 coupled to the substrate 202 relative to the housing 224 may be 2:1, 3:1, 4:1, 6:1, or any ratio therebetween.

In an embodiment, each of the interconnect devices 242 may form a substantially continuous electrical conductor when electrically coupled, e.g., when soldered or otherwise electrically coupled, to associated pads 222 of the substrate 202 and the pads 244 of the housing 224. The continuous electrical conductor may be straight, e.g., without bends. Although the interconnects 242-2 may be configured to carry a DC signal, the associated pads of the substrate 202 and the housing 224 may not necessarily be electrically coupled to the light engine driving circuit 210 and the laser packages 240, which may also be referred to as laser transmitter arrangements or simply laser arrangements (See FIG. 3). Instead, the interconnects 242-2 may be electrically isolated and may simply be present to provide structural support (e.g., to prevent rotational movement) between the substrate 202 and the housing 224 and/or a ground connection. Alternatively, one or more of the interconnects 242-2 may be electrically isolated while others may be utilized to provide a DC signal between the substrate 202 and the hermetically-sealed light engine 204.

Continuing on, a second type of interconnect 246 may electrically couple the substrate 202 to the hermetically-sealed light engine 204 to provide RF signaling. The second type of interconnect 246 may comprise wire bonding, as shown, although other types of interconnect devices may be utilized. As shown, the embodiment of FIGS. 2B and 2C include a plurality of the second type of interconnect 246. Wire bonding may be particularly well suited for transmission of high-frequency RF signals. However, wire bonding can be easily damaged based on, for instance, movement between the substrate 202 and the housing 224. In an embodiment, the first interconnect devices 242 may introduce rigidity and a secure connection between the substrate 202 and the housing 224 to prevent or otherwise mitigate the potential for such damage.

Figure 3:
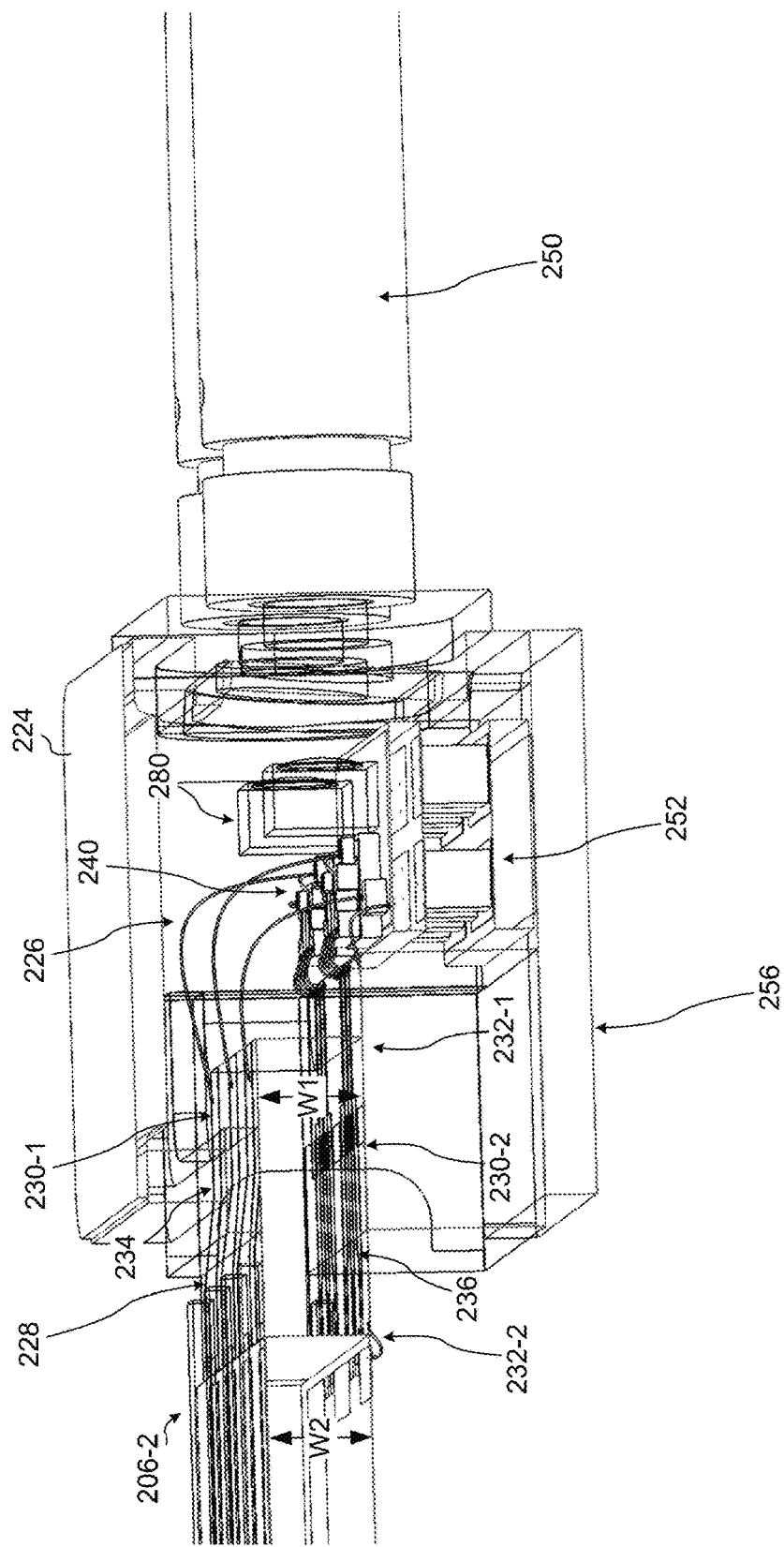
FIG. 3 shows a cross-sectional view of a hermetically-sealed housing consistent with an embodiment of the present disclosure.

FIG. 3 shows a cross-sectional view of the housing 224 consistent with an embodiment of the present disclosure. The housing 224 depicted in FIG. 3 includes transparent sections for clarity and for ease of explanation. As shown, the housing 224 includes a plurality of sidewalls that define cavity 226. The cavity 226 includes laser packages 240 disposed therein. The laser packages 240 may be configured to launch associated channel wavelengths into a fiber, e.g., one of fibers 254 (See FIG. 2B), or other waveguide disposed in connector/receptacle 250. Note, the fibers 254 may be implemented as the transmit optical fiber 122 of FIGS. 1A and 1B. Focusing lenses, e.g., focus lens 280, may be disposed within the cavity 226 and aligned with associated laser packages to launch light emitted from the same into a fiber or waveguide of receptacle 250. The cavity 226 may also include temperature control devices 252 in thermal communication with the laser packages 240. The temperature control devices 252 may comprise TECs or other suitable devices. The temperature control devices 252 may also be in thermal communication with the bottom sidewall 256 to allow for transfer of heat. Therefore, the temperature control devices 252 may advantageously disperse heat through a metal housing (or other housing) that the housing 224 may be disposed in.

The cavity 226 may be at least partially formed by a feedthrough device 228, which may also be referred to as a passthrough device 228. The feedthrough device 228 may comprise, for example, a suitably rigid non-metal material such as inorganic material such as a crystalline oxide, nitride or carbide material, which may be commonly referred to as ceramic. Some elements, such as carbon or silicon, may also be considered ceramics, and are also within the scope of this disclosure. A first portion 232-1 of the feedthrough device 228 may at least partially extend into the cavity and a second portion 232-2 may extend from the cavity 226.

The feedthrough device 228 may be defined by at least a first mounting surface 230-1 and a second mounting surface 230-2 disposed opposite the first surface 230-1 in an opposing arrangement/configuration. Each of the first and second mounting surfaces 230-1 and 230-2 may include traces disposed/patterned thereon, and may also be referred to herein as simply first and second surfaces 230-1, 230-2. For example, the first surface 203-1 may include power traces 234 (or DC traces 234) disposed thereon that are configured for transmission of DC signals. On the other hand, the second surface 230-2 may include traces 236 (or RF traces 236) disposed thereon that are configured for transmission of RF signals. The feedthrough device 228 may include a width (or thickness) of W1, with W1 being between 0.1 mm to 2 mm, although other dimensions are within the scope of this disclosure. The width W1 may be configured to allow the feedthrough device 228 to prevent or otherwise reduce electrical interference between the DC and RF signals carried by the traces 234 and 236, respectively. The width W1 of the feedthrough device 228 may be equal to the width W2 of the substrate 202. However, the widths W1 and W2 may not necessarily be equal and width W2 may be greater or less than the width W1. As further shown, the first and second mounting surfaces 214-1, 214-2 of the substrate 202 may extend in parallel, and may be substantially coplanar, with the first and second surfaces 230-1, 230-2 of the feedthrough device 228 when the substrate 202 and the feedthrough device 228, are coupled together.

Continuing on, a first end of the DC traces 234 may be electrically coupled to the substrate 202, and more particularly, the light engine driving circuit 210 via respective interconnect devices, such as the first type of interconnect devices 242-1. The second end of the DC traces 234 on the first surface 230-1 of the feedthrough device 228 may then be wire bonded, such as shown, or otherwise electrically coupled to the laser transmitter arrangements 240 via a suitable approach. Each laser transmitter arrangement 240 may comprise, for instance, a laser diode and a monitor photodiode and may be configured to emit an associated channel wavelength. Likewise, a first end of the RF traces 234 electrically couple to the light engine driving circuit 210 via respective interconnect devices, e.g., the second type of interconnect devices 242-2, and a second end electrically couples to the laser transmitter arrangements 240 via wire bonding or other suitable approach.

In an accordance with an aspect of the present disclosure a transmitter optical subassembly (TOSA) module is disclosed. The TOSA module comprising a hermetically-sealed light engine with a housing that defines a hermetic-sealed cavity and at least one laser package for emitting an associated channel wavelength disposed within the hermetic-sealed cavity, a substrate defined by first and second surfaces disposed opposite each other, the substrate including an electrical coupling region for electrically coupling with a transmit connecting circuit and a light engine interface region for electrically coupling with the hermetically-sealed light engine, a light engine driving circuit disposed on the substrate to provide a radio frequency (RF) signal and a power signal to drive the hermetically-sealed light engine to output one or more channel wavelengths, and wherein the substrate includes at least a first trace disposed on the first surface to provide the power signal and at least a second trace disposed on the second surface to provide the RF signal, the first and second traces being disposed in an opposing arrangement to provide electrical isolation to reduce electrical interference between the power signal and the RF signal.

In accordance with another aspect of the present disclosure an optical transceiver. The optical transceiver comprising a housing, a transmitter optical subassembly (TOSA) module disposed in the housing, the TOSA module comprising a hermetically-sealed light engine with a housing that defines a hermetic-sealed cavity and at least one laser package disposed within the hermetic-sealed cavity, a substrate defined by first and second surfaces disposed opposite each other, the substrate including an electrical coupling region for electrically coupling with a transmit connecting circuit and a light engine interface region for electrically coupling with the hermetically-sealed light engine, a light engine driving circuit disposed on the substrate to provide a radio frequency (RF) signal and a power signal to drive the hermetically-sealed light engine to output one or more channel wavelengths, and wherein the substrate includes at least a first trace disposed on the first surface to provide the power signal, and at least a second trace disposed on the second surface to provide the RF signal, the first and second traces being disposed in an opposing arrangement to provide electrical isolation to reduce electrical interference between the power signal and the RF signal, a receive optical subassembly (ROSA) module disposed in the housing.

While the principles of the invention have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A transmitter optical subassembly (TOSA) module comprising:
   a hermetically-sealed light engine with a housing that defines a hermetic-sealed cavity and at least one laser package for emitting an associated channel wavelength disposed within the hermetic-sealed cavity;
   a substrate defined by first and second surfaces disposed opposite each other, the substrate including an electrical coupling region for electrically coupling with a transmit connecting circuit and a light engine interface region for electrically coupling with the hermetically-sealed light engine;
   a light engine driving circuit disposed on the substrate to provide a radio frequency (RF) signal and a power signal to drive the hermetically-sealed light engine to output one or more channel wavelengths;
   wherein the substrate includes at least a first trace disposed on the first surface to provide the power signal and at least a second trace disposed on the second surface to provide the RF signal, the first and second traces being disposed in an opposing arrangement to provide electrical isolation to reduce electrical interference between the power signal and the RF signal
   a feedthrough device to electrically couple the at least one laser package to the light engine driving circuit; and
   wherein the feedthrough device is defined by at least a first surface disposed opposite a second surface, and wherein the first and second surfaces extend substantially parallel with the first and second surfaces of the substrate.

2. The TOSA module of claim 1, further comprising at least a first interconnect device of a first type electrically coupled to the first trace and a corresponding trace of the hermetically-sealed light engine housing to provide the power signal, and at least a second interconnect device of a second type electrically coupled to the second trace and a corresponding trace of the hermetically-sealed light engine housing to provide the RF signal, the first and second types of interconnect devices being different.

3. The TOSA module of claim 2, wherein the first type of interconnect device is a DC bus bar interconnect.

4. The TOSA module of claim 2, wherein the second type of interconnect device is a wire bond.

5. The TOSA module of claim 1, further comprising at least one ground trace disposed on the second surface adjacent the second trace.

6. The TOSA module of claim 5, further comprising a DC bus bar interconnect device electrically coupled to the at least one ground trace and a wire bond electrically coupled to the second trace.

7. The TOSA module of claim 1, wherein the electrical isolation is provided at least in part by a width of the substrate and/or material properties of a material that forms the substrate.

8. The TOSA module of claim 1, further comprising a plurality of electrical interconnects that brace the substrate to the housing of the hermetically-sealed light engine.

9. The TOSA module of claim 1, wherein the feedthrough device is configured to directly couple to the substrate with an end-to-end connection.

10. The TOSA module of claim 1, wherein the first and second surfaces of the feedthrough device are substantially coplanar with the first and second surfaces of the substrate when the feedthrough device and substrate are coupled together.

11. The TOSA module of claim 1, further comprising at least one trace for receiving the power signal from the light engine driving circuit disposed on the first surface of the feedthrough and at least one trace for receiving the RF signal from the light engine driving circuit disposed on the second surface.

12. An optical transceiver comprising:
   a housing;
   a transmitter optical subassembly (TOSA) module disposed in the housing, the TOSA module comprising:
      a hermetically-sealed light engine with a housing that defines a hermetic-sealed cavity and at least one laser package disposed within the hermetic-sealed cavity;
      a substrate defined by first and second surfaces disposed opposite each other, the substrate including an electrical coupling region for electrically coupling with a transmit connecting circuit and a light engine interface region for electrically coupling with the hermetically-sealed light engine;
      a light engine driving circuit disposed on the substrate to provide a radio frequency (RF) signal and a power signal to drive the hermetically-sealed light engine to output one or more channel wavelengths; and wherein the substrate includes at least a first trace disposed on the first surface to provide the power signal, and at least a second trace disposed on the second surface to provide the RF signal, the first and second traces being disposed in an opposing arrangement to provide electrical isolation to reduce electrical interference between the power signal and the RF signal;

at least a first interconnect device of a first type electrically coupled to the first trace and a corresponding trace of the hermetically-sealed light engine to provide the power signal, and at least a second interconnect device of a second type electrically coupled to the second trace and a corresponding trace of the hermetically-sealed light engine to provide the RF signal, the first and second types of interconnect devices being different;

a receive optical subassembly (ROSA) module disposed in the housing.

13. The optical transceiver of claim 12, wherein the first type of interconnect device comprises a DC bus bar disposed on the first and second surfaces of the substrate.

14. The optical transceiver of claim 12, wherein the second type of interconnect device is a wire bonds.

15. A transmitter optical subassembly (TOSA) module comprising:

a hermetically-sealed light engine with a housing that defines a hermetic-sealed cavity and at least one laser package for emitting an associated channel wavelength disposed within the hermetic-sealed cavity;

a substrate defined by first and second surfaces disposed opposite each other, the substrate including an electrical coupling region for electrically coupling with a transmit connecting circuit and a light engine interface region for electrically coupling with the hermetically-sealed light engine;

a light engine driving circuit disposed on the substrate to provide a radio frequency (RF) signal and a power signal to drive the hermetically-sealed light engine to output one or more channel wavelengths;

wherein the substrate includes at least a first trace disposed on the first surface to provide the power signal and at least a second trace disposed on the second surface to provide the RF signal, the first and second traces being disposed in an opposing arrangement to provide electrical isolation to reduce electrical interference between the power signal and the RF signal; and at least a first interconnect device of a first type electrically coupled to the first trace and a corresponding trace of the hermetically-sealed light engine housing to provide the power signal, and at least a second interconnect device of a second type electrically coupled to the second trace and a corresponding trace of the hermetically-sealed light engine housing to provide the RF signal, the first and second types of interconnect devices being different.

16. The TOSA module of claim 15, wherein the first type of interconnect device is a DC bus bar interconnect.

17. The TOSA module of claim 15, wherein the second type of interconnect device is a wire bond.

* * * * *